(12) United States Patent
Hayasaka et al.

(10) Patent No.: US 11,777,429 B2
(45) Date of Patent: Oct. 3, 2023

(54) CONTROL DEVICE AND FAILURE DETERMINATION METHOD

(71) Applicant: Hitachi Astemo, Ltd., Hitachinaka (JP)

(72) Inventors: Keisuke Hayasaka, Ibaraki (JP); Ryoichi Inada, Ibaraki (JP); Satoru Shigeta, Ibaraki (JP)

(73) Assignee: Hitachi Astemo, Ltd., Hitachinaka (JP)

( * ) Notice: Subject to any disclaimer, the term of this patent is extended or adjusted under 35 U.S.C. 154(b) by 59 days.

(21) Appl. No.: 17/603,706

(22) PCT Filed: Apr. 3, 2020

(86) PCT No.: PCT/JP2020/015286
§ 371 (c)(1),
(2) Date: Oct. 14, 2021

(87) PCT Pub. No.: WO2020/217926
PCT Pub. Date: Oct. 29, 2020

(65) Prior Publication Data
US 2022/0200500 A1 Jun. 23, 2022

(30) Foreign Application Priority Data

Apr. 24, 2019 (JP) .................................. 2019-082481

(51) Int. Cl.
*H02P 23/14* (2006.01)
*H02P 27/08* (2006.01)

(52) U.S. Cl.
CPC .............. *H02P 23/14* (2013.01); *H02P 27/08* (2013.01)

(58) Field of Classification Search
CPC ...... H02P 21/00; H02P 21/0003; H02P 21/22; H02P 21/20; H02P 21/14; H02P 23/00;
(Continued)

(56) References Cited

U.S. PATENT DOCUMENTS 10,177,694 B2\* 1/2019 Oka ..................... H02P 27/085
2005/0093505 A1 5/2005 Kameya
(Continued)

FOREIGN PATENT DOCUMENTS

JP 2005-143153 A 6/2005
JP 2009-303283 A 12/2009
(Continued)

OTHER PUBLICATIONS

International Search Report with English translation and Written Opinion issued in corresponding application No. PCT/JP2020/015286 dated Jul. 7, 2020.

*Primary Examiner* — Antony M Paul
(74) *Attorney, Agent, or Firm* — Foley & Lardner LLP

(57) ABSTRACT

A failure phase of an AC current sensor is determined without providing a DC current sensor. A control device that controls a motor via an inverter circuit that supplies power converted from direct current to three-phase alternating current to the motor, in which a current sensor that detects alternating current of each phase of three-phase alternating current is provided at an output of the inverter circuit, and the control device calculates estimated DC current values by using a duty value of a PWM signal for controlling switching of the inverter circuit and an AC current value of two phases among three phases detected by the current sensor, and determines a failure of the current sensor on the basis of a change in the estimated DC current values that have been calculated.

12 Claims, 8 Drawing Sheets

(58) Field of Classification Search
CPC ........ H02P 23/14; H02P 25/00; H02P 25/022; H02P 25/062; H02P 25/064; H02P 25/089; H02P 27/00; H02P 27/04; H02P 27/06; H02P 27/08; H02P 1/00; H02P 1/04; H02P 1/46; H02P 6/00; H02P 6/12; H02P 6/28
See application file for complete search history.

(56) References Cited

U.S. PATENT DOCUMENTS

| | | |
|---|---|---|
| 2014/0088831 A1 | 3/2014 | Hisazumi et al. |
| 2019/0187219 A1 | 6/2019 | Inada et al. |

FOREIGN PATENT DOCUMENTS

| | | |
|---|---|---|
| JP | 2014-064430 A | 4/2014 |
| JP | 2017-208893 A | 11/2017 |

\* cited by examiner

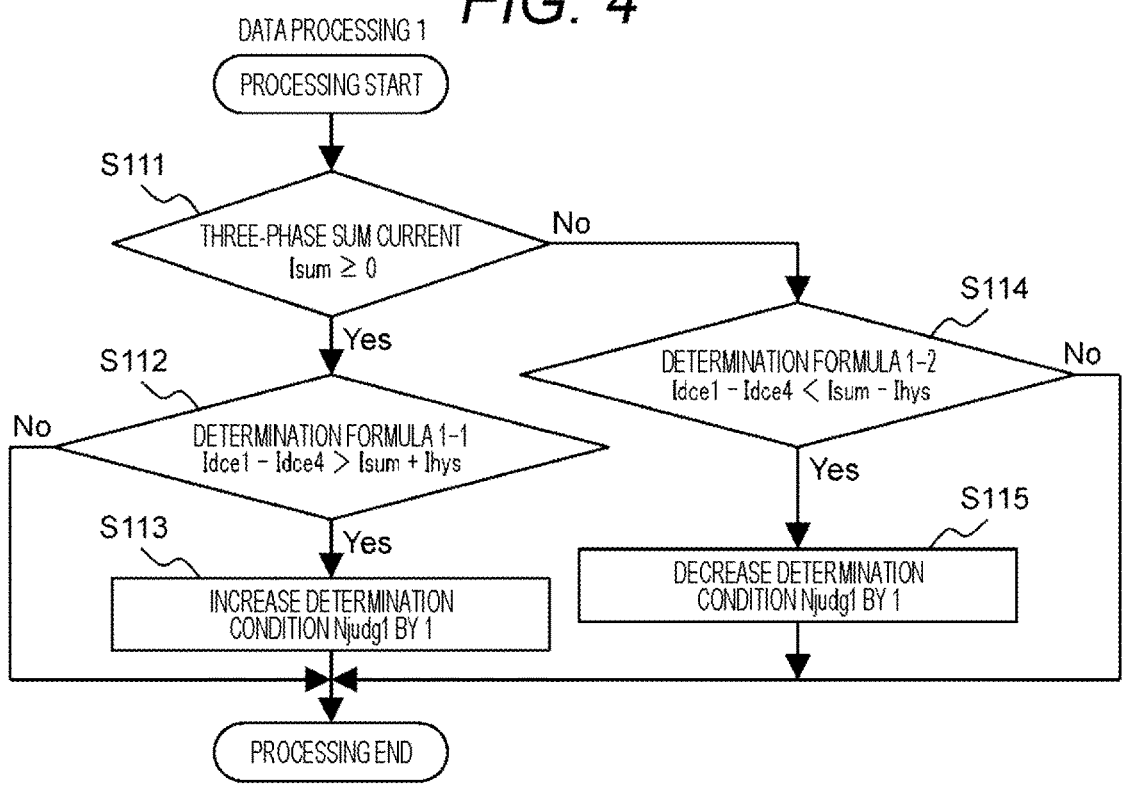
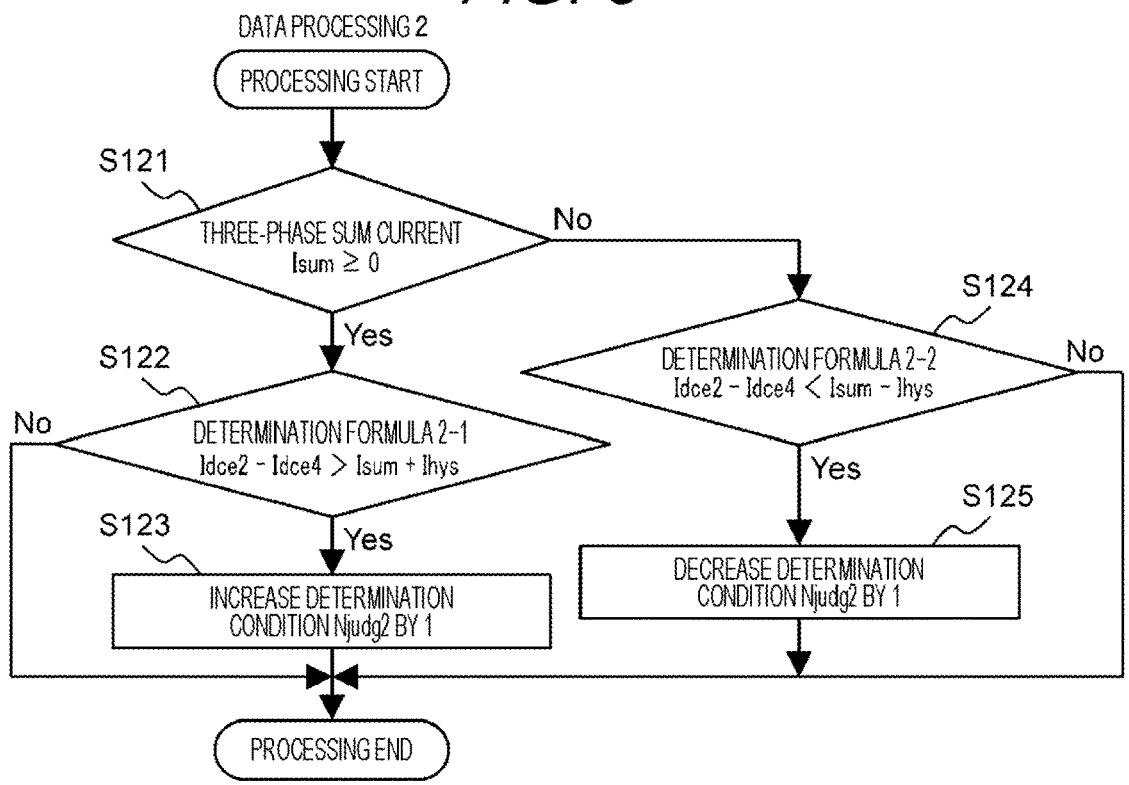

FIG. 6

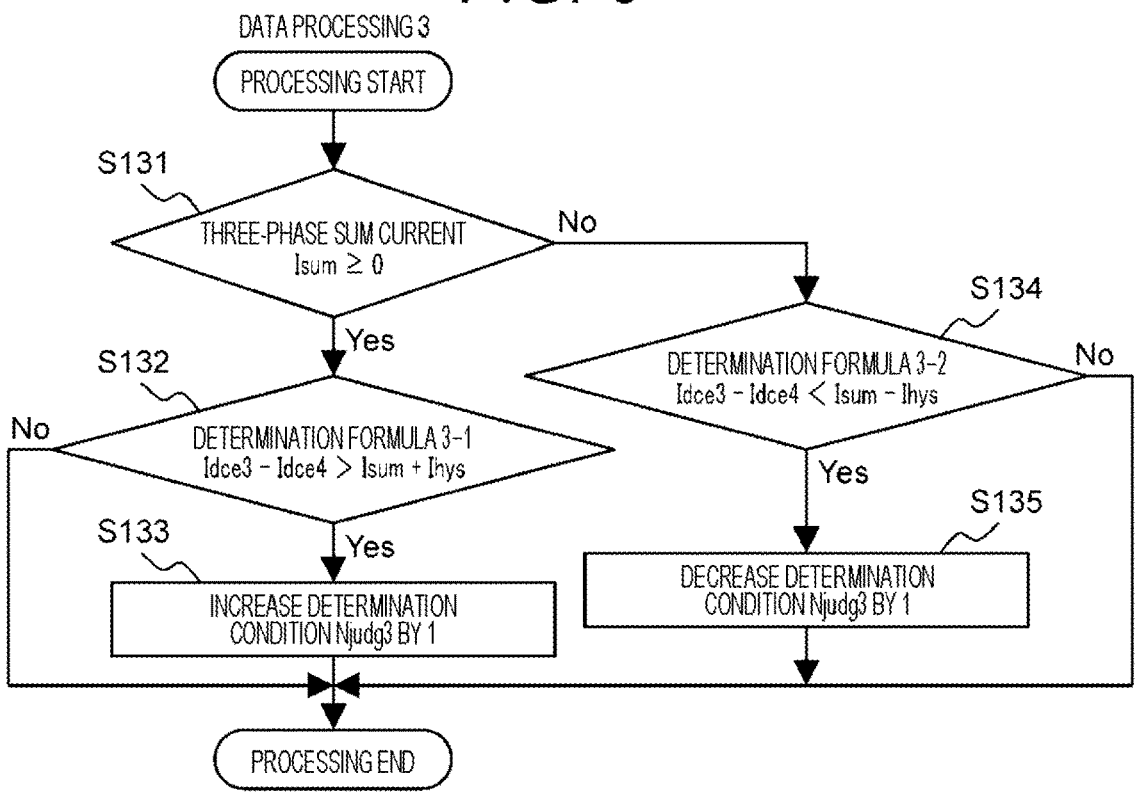

FIG. 7

| INCREASE AND DECREASE TENDENCY IN DETERMINATION CONDITION | | | AC CURRENT SENSOR GAIN FAILURE | |
|---|---|---|---|---|
| Njudg1 | Njudg2 | Njudg3 | FAILURE PHASE | LARGE OR SMALL OF GAIN FAILURE |
| INCREASE | DECREASE | DECREASE | U-PHASE | SMALL GAIN FAILURE |
| DECREASE | INCREASE | INCREASE | U-PHASE | LARGE GAIN FAILURE |
| DECREASE | INCREASE | DECREASE | V-PHASE | SMALL GAIN FAILURE |
| INCREASE | DECREASE | INCREASE | V-PHASE | LARGE GAIN FAILURE |
| DECREASE | DECREASE | INCREASE | W-PHASE | SMALL GAIN FAILURE |
| INCREASE | INCREASE | DECREASE | W-PHASE | LARGE GAIN FAILURE |

GAIN FAILURE DETERMINATION TABLE 1 (AT THE TIME OF POWER RUNNING)

FIG. 8

| INCREASE AND DECREASE TENDENCY IN DETERMINATION CONDITION | | | AC CURRENT SENSOR GAIN FAILURE | |
|---|---|---|---|---|
| Njudg1 | Njudg2 | Njudg3 | FAILURE PHASE | LARGE OR SMALL OF GAIN FAILURE |
| INCREASE | NO INCREASE AND DECREASE | NO INCREASE AND DECREASE | U-PHASE | SMALL GAIN FAILURE |
| DECREASE | NO INCREASE AND DECREASE | NO INCREASE AND DECREASE | U-PHASE | LARGE GAIN FAILURE |
| NO INCREASE AND DECREASE | INCREASE | NO INCREASE AND DECREASE | V-PHASE | SMALL GAIN FAILURE |
| NO INCREASE AND DECREASE | DECREASE | NO INCREASE AND DECREASE | V-PHASE | LARGE GAIN FAILURE |
| NO INCREASE AND DECREASE | NO INCREASE AND DECREASE | INCREASE | W-PHASE | SMALL GAIN FAILURE |
| NO INCREASE AND DECREASE | NO INCREASE AND DECREASE | DECREASE | W-PHASE | LARGE GAIN FAILURE |

GAIN FAILURE DETERMINATION TABLE 2 (AT THE TIME OF POWER RUNNING)

FIG. 9

| INCREASE AND DECREASE TENDENCY IN DETERMINATION CONDITION | | | AC CURRENT SENSOR GAIN FAILURE | |
|---|---|---|---|---|
| Njudg1 | Njudg2 | Njudg3 | FAILURE PHASE | LARGE OR SMALL OF GAIN FAILURE |
| INCREASE | DECREASE | DECREASE | U-PHASE | LARGE GAIN FAILURE |
| DECREASE | INCREASE | INCREASE | U-PHASE | SMALL GAIN FAILURE |
| DECREASE | INCREASE | DECREASE | V-PHASE | LARGE GAIN FAILURE |
| INCREASE | DECREASE | INCREASE | V-PHASE | SMALL GAIN FAILURE |
| DECREASE | DECREASE | INCREASE | W-PHASE | LARGE GAIN FAILURE |
| INCREASE | INCREASE | DECREASE | W-PHASE | SMALL GAIN FAILURE |

GAIN FAILURE DETERMINATION TABLE 3 (AT THE TIME OF REGENERATION)

FIG. 10

| INCREASE AND DECREASE TENDENCY IN DETERMINATION CONDITION | | | AC CURRENT SENSOR GAIN FAILURE | |
|---|---|---|---|---|
| Njudg1 | Njudg2 | Njudg3 | FAILURE PHASE | LARGE OR SMALL OF GAIN FAILURE |
| INCREASE | NO INCREASE AND DECREASE | NO INCREASE AND DECREASE | U-PHASE | LARGE GAIN FAILURE |
| DECREASE | NO INCREASE AND DECREASE | NO INCREASE AND DECREASE | U-PHASE | SMALL GAIN FAILURE |
| NO INCREASE AND DECREASE | INCREASE | NO INCREASE AND DECREASE | V-PHASE | LARGE GAIN FAILURE |
| NO INCREASE AND DECREASE | DECREASE | NO INCREASE AND DECREASE | V-PHASE | SMALL GAIN FAILURE |
| NO INCREASE AND DECREASE | NO INCREASE AND DECREASE | INCREASE | W-PHASE | LARGE GAIN FAILURE |
| NO INCREASE AND DECREASE | NO INCREASE AND DECREASE | DECREASE | W-PHASE | SMALL GAIN FAILURE |

GAIN FAILURE DETERMINATION TABLE 4 (AT THE TIME OF REGENERATION)

FIG. 11

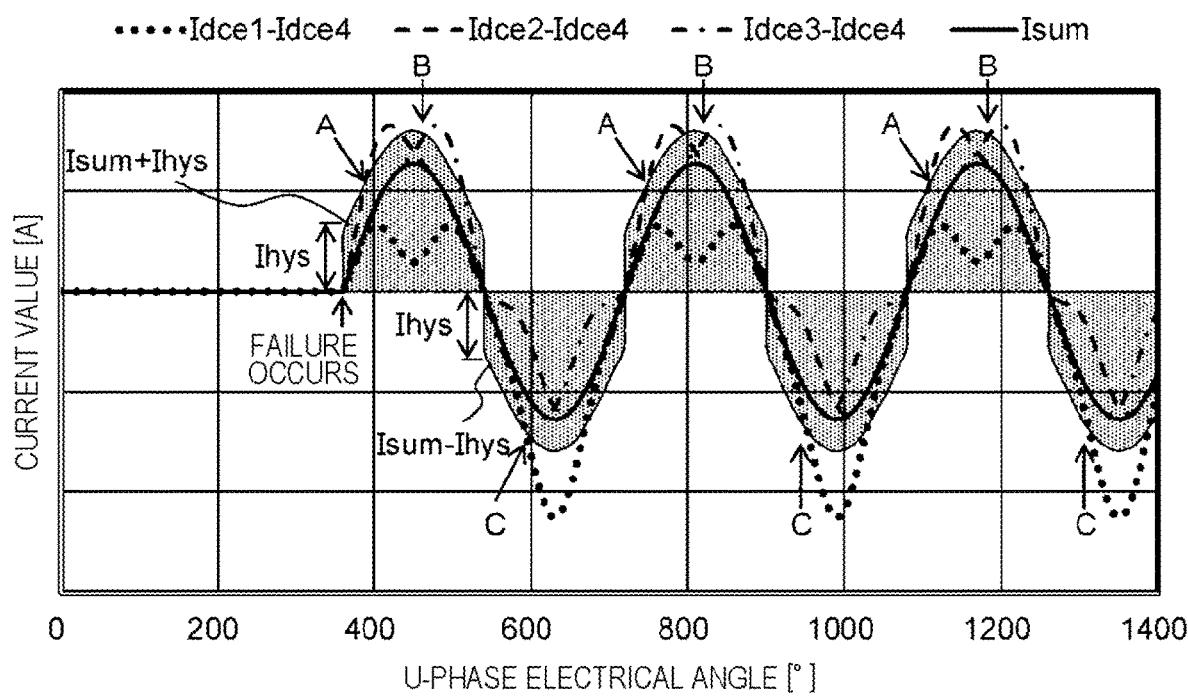

FIG. 12

| FLUCTUATION FREQUENCY | | | AC CURRENT SENSOR GAIN FAILURE |
|---|---|---|---|
| F1 | F2 | F3 | FAILURE PHASE |
| MINIMUM VALUE | >F1 | >F1 | U-PHASE |
| >F2 | MINIMUM VALUE | >F2 | V-PHASE |
| >F3 | >F3 | MINIMUM VALUE | W-PHASE |

GAIN FAILURE DETERMINATION TABLE 5

FIG. 13

| PEAK-TO-PEAK VALUE | | | AC CURRENT SENSOR GAIN FAILURE |
|---|---|---|---|
| Idce1p-p | Idce2p-p | Idce3p-p | FAILURE PHASE |
| MINIMUM VALUE | >Idce1p-p | >Idce1p-p | U-PHASE |
| >Idce2p-p | MINIMUM VALUE | >Idce2p-p | V-PHASE |
| >Idce3p-p | >Idce3p-p | MINIMUM VALUE | W-PHASE |

GAIN FAILURE DETERMINATION TABLE 6

CONTROL DEVICE AND FAILURE DETERMINATION METHOD

TECHNICAL FIELD

The present invention relates to a motor control device, and more particularly to failure determination of a current sensor.

BACKGROUND ART

The following prior arts are the background technologies in this technical field. PTL 1 (JP 2017-208893 A) discloses an inverter control device that controls an inverter circuit, calculates an estimated DC current value on the basis of a duty value and an AC current sensor value output from an AC current sensor, and diagnoses the DC current sensor on the basis of the estimated DC current value and the DC current sensor value output from the DC current sensor (see Abstract).

PTL 2 (JP 2009-303283 A) discloses an electric motor control device that more appropriately determines an offset occurring in a sensor that detects a phase current in a moving state and corrects the offset (see Abstract).

CITATION LIST

Patent Literature

PTL 1: JP 2017-208893 A
PTL 2: JP 2009-303283 A

SUMMARY OF INVENTION

Technical Problem

As disclosed in PTL 1, an AC current sensor and a DC current sensor are mounted on an inverter that controls a rotating electrical machine. However, since the DC current sensor is used only for diagnostic purposes and is not used for controlling the rotating electrical machine, cost reduction by reducing the number of DC current sensors is required. Instead of the DC current value measured by the DC current sensor, a DC current value can be estimated using a sensor value of an AC current sensor and a gate signal to a power module. However, there is a problem that the AC current sensor value and the DC current estimation value become abnormal values at the same time when the AC current sensor fails.

The inverter diagnoses the failure of the AC current sensor by three-phase sum diagnosis or range diagnosis, but it is difficult to accurately detect a gain failure in both cases. In order to reduce the number of DC current sensors, it is necessary to detect a gain failure of an AC current sensor.

Solution to Problem

A representative example of the invention disclosed in the present application is as follows. That is, a representative example is a control device that controls a motor via an inverter circuit that supplies power converted from direct current to three-phase alternating current to the motor, in which a current sensor that detects alternating current of each phase of three-phase alternating current is provided at an output of the inverter circuit, and the control device calculates each of the estimated DC current values by using a duty value of a PWM signal for controlling switching of the inverter circuit and an AC current value of two phases among three phases detected by the current sensor, and determines a failure of the current sensor on the basis of a change in each of the estimated DC current values that have been calculated.

Advantageous Effects of Invention

According to one aspect of the present invention, it is possible to determine a failure phase of an AC current sensor without providing a DC current sensor. The problems, configurations, and effects other than those described above will be clarified from the description of the embodiments below.

BRIEF DESCRIPTION OF DRAWINGS

FIG. 4 is a flowchart of data processing 1 of the first embodiment.

FIG. 5 is a flowchart of data processing 2 of the first embodiment.

FIG. 6 is a flowchart of data processing 3 of the first embodiment.

FIG. 7 is a diagram illustrating a configuration example of a gain failure determination table 1 of the first embodiment.

FIG. 8 is a diagram illustrating a configuration example of a gain failure determination table 2 of the first embodiment.

FIG. 9 is a diagram illustrating a configuration example of a gain failure determination table 3 of the first embodiment.

FIG. 10 is a diagram illustrating a configuration example of a gain failure determination table 4 of the first embodiment.

FIG. 11 is a diagram illustrating a current waveform in a case where a U-phase AC current sensor fails.

FIG. 12 is a diagram illustrating a configuration example of a gain failure determination table 5 of a second embodiment.

FIG. 13 is a diagram illustrating a configuration example of a gain failure determination table 6 of a third embodiment.

DESCRIPTION OF EMBODIMENTS

Embodiments will be described below with reference to the drawings. In the embodiments below, a control system of a rotating electrical machine that determines a failure phase of an AC current sensor will be described.

First Embodiment

Figure 1:
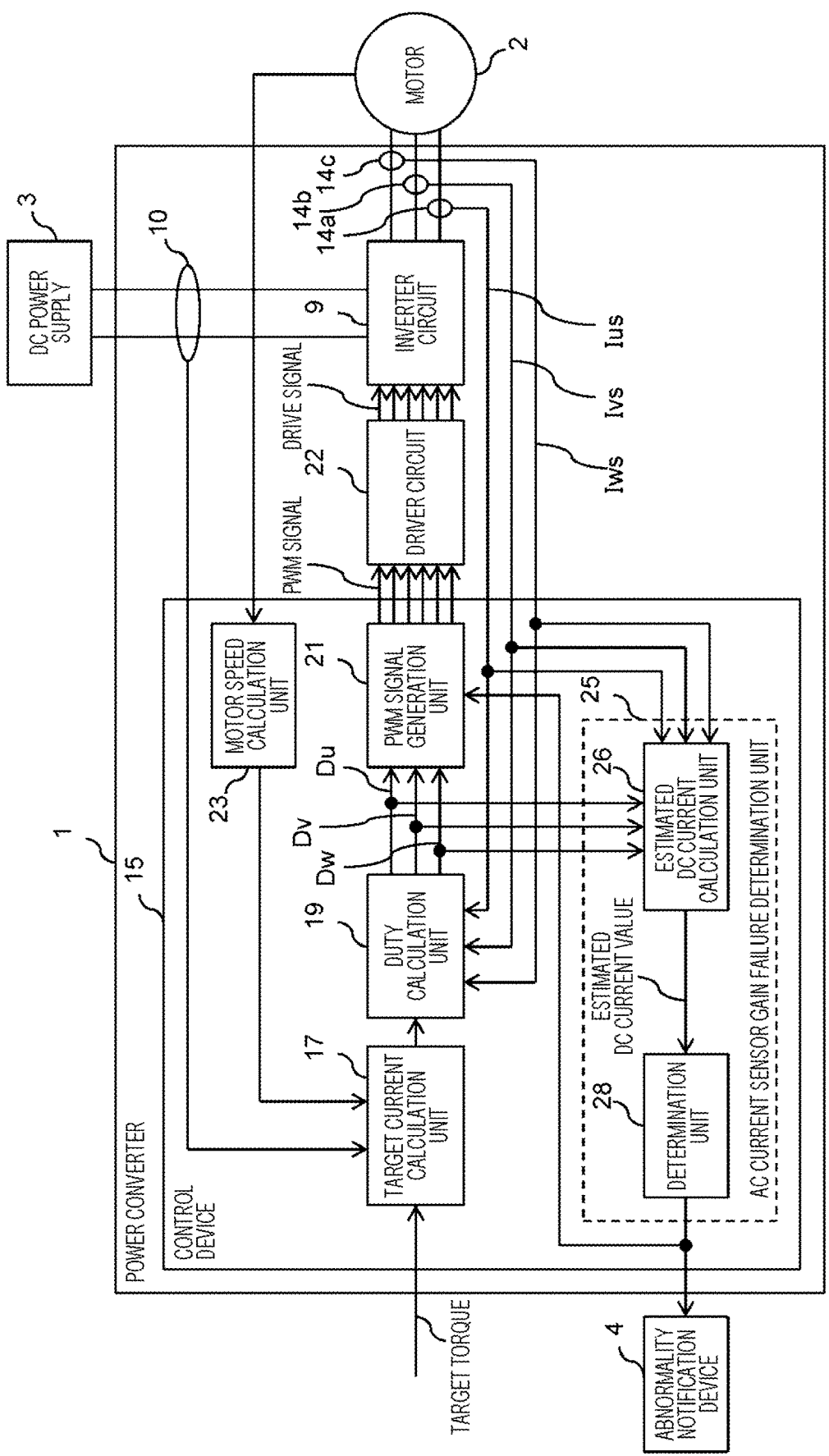
FIG. 1 is a diagram illustrating a configuration example of a power converter and peripheral devices thereof according to an embodiment of the present invention.

FIG. 1 is a diagram illustrating a configuration example of a power converter 1 and peripheral devices thereof according to an embodiment of the present invention.

The power converter 1 converts DC power obtained from a DC power supply 3 into AC power to drive a motor 2. The power converter 1 also has a function of converting power of the motor 2 into DC power to charge the DC power supply 3. The DC power supply 3 is a power supply such as a battery for driving the motor 2. As for the DC current supplied from the DC power supply 3, a direction in which the DC current flows from a positive electrode of the DC power supply 3 to the power converter 1 is positive, and the opposite direction is negative.

The motor 2 is a three-phase motor having three windings therein. An angle sensor (not illustrated) for measuring a rotation angle is mounted on the motor 2, and the angle sensor outputs the measured rotation angle of the motor 2 to the power converter 1 as an angle sensor value.

The power converter 1 includes a control device 15, a driver circuit 22, an inverter circuit 9, AC current sensors 14a to 14c, a voltage sensor 10, and an AC current sensor gain failure determination unit 25.

The voltage sensor 10 is a sensor that measures an output voltage of the DC power supply 3, and outputs a measured voltage value to the control device 15 as a voltage sensor value.

The AC current sensors 14a to 14c are sensors that measure an AC current flowing through each phase (U-phase, V-phase, W-phase) of the motor 2. The AC current sensor 14a measures an AC current value Iu flowing through the U-phase, and outputs an AC current sensor value Ius to the control device 15. As similar to this, the AC current sensor 14b measures an AC current value Iv flowing in the V-phase, and outputs an AC current sensor value Ivs to the control device 15. The AC current sensor 14c measures an AC current value Iw flowing in the W-phase, and outputs an AC current sensor value Iws to the control device 15. As for the AC current, a direction in which the AC current flows from the power converter 1 to the motor 2 is positive, and the opposite direction is negative.

In the present embodiment, the AC current sensors 14a to 14c are provided in the power converter 1, but may be provided outside the power converter 1 (for example, between the power converter 1 and the motor 2, or inside the motor 2).

The control device 15 communicates with an electronic control device (not illustrated) outside the power converter 1, and receives a target torque of the motor 2 from another electronic control device. The control device 15 drives the motor 2 by controlling the inverter circuit 9 via the driver circuit 22 on the basis of the target torque. When the control device 15 determines that a failure has occurred in the inside of the power converter 1, the control device 15 outputs an abnormality notification signal to an external abnormality notification device 4.

The control device 15 internally includes a communication circuit (not illustrated), a motor speed calculation unit 23, a target current calculation unit 17, a duty calculation unit 19, a PWM signal generation unit 21, and an AC current sensor gain failure determination unit 25.

The motor speed calculation unit 23 calculates a motor rotation speed from a change in an angle sensor value in the motor, and outputs the calculated motor speed value to the target current calculation unit 17.

The target current calculation unit 17 calculates a current value of current to be supplied to the motor 2 using the target torque, the voltage sensor value, and the motor speed value output from the motor speed calculation unit 23, and outputs the current value to the duty calculation unit 19 as a target current value. The target current value includes information on a d-axis target current value and a q-axis target current value.

The duty calculation unit 19 calculates a U-phase duty value Du, a V-phase duty value Dv, and a W-phase duty value Dw on the basis of the target current value output from the target current calculation unit 17 and the AC current sensor values Ius, Ivs, Iws, and outputs the calculated values to the PWM signal generation unit 21 and the AC current sensor gain failure determination unit 25. The U-phase duty value Du indicates an ON time ratio of a U-phase upper arm power semiconductor 90a, and an ON time ratio of a U-phase lower arm power semiconductor 90b paired with the U-phase upper arm power semiconductor is indicated by 1-Du. As similar to this, the V-phase duty value Dv indicates an ON time ratio of a V-phase upper arm power semiconductor 90c, and an ON time ratio of a V-phase lower arm power semiconductor 90d is indicated by 1-Dv. The W-phase duty value Dw indicates an ON time ratio of a W-phase upper arm power semiconductor 90e, and an ON time ratio of a W-phase lower arm power semiconductor 90f is indicated by 1-Dw.

The division of the upper arm and the lower arm will be described with reference to FIG. 2.

The PWM signal generation unit 21 includes a timer (not illustrated) therein, generates a pulse wide modulation (PWM) signal on the basis of a timer value, the U-phase duty value Du, the V-phase duty value Dv, and the W-phase duty value Dw, and outputs the PWM signal to the driver circuit 22.

When the abnormality notification signal is output from the AC current sensor gain failure determination unit 25, the PWM signal generation unit 21 controls the PWM signal so that the motor 2 is not driven. The state in which the motor 2 is not driven includes, for example, a state in which all the six power semiconductors in the inverter circuit 9 are turned off (referred to as a free wheel state in the present embodiment). As other examples, there are a state in which three upper arms are turned on and three lower arms are turned off among the six power semiconductors (referred to as an upper arm active short state in the present embodiment) and a state in which three upper arms are turned off and three lower arms are turned on (referred to as a lower arm active short state in the present embodiment).

The AC current sensor gain failure determination unit 25 determines failure of the AC current sensors 14a to 14c, and includes an estimated DC current calculation unit 26 and a determination unit 28 therein. The AC current sensor gain failure determination unit 25 includes a computer (microcomputer) including an operation device, a memory, and an input and output device.

The operation device includes a processor and executes a program stored in a memory. A part of the processing performed by the operation device executing the program may be executed by another operation device (for example, hardware such as a field programable gate array (FPGA) and an application specific integrated circuit (ASIC)).

The memory includes a ROM and a RAM which are nonvolatile storage elements. The ROM stores an invariable program (for example, BIOS) and the like. The RAM is a high-speed and volatile storage element such as a dynamic random access memory (DRAM) and a nonvolatile storage element such as a static random access memory (SRAM), and stores a program executed by the operation device and data used when the program is executed.

The input and output device is an interface that transmits processing contents by the AC current sensor gain failure determination unit 25 to the outside or receives data from the outside according to a predetermined protocol.

The program executed by the operation device is stored in a nonvolatile memory which is a non-transitory storage medium of the AC current sensor gain failure determination unit 25.

The estimated DC current calculation unit 26 calculates four estimated DC current values and three-phase sum current value on the basis of the duty values Du, Dv, Dw of the respective phases and the AC current sensor values Ius, Ivs, Iws, and outputs the calculated values to the determination unit 28. The determination unit 28 uses the four estimated DC current values and the three-phase sum current value to determine whether the gain failure of the AC current sensors 14a to 14c is large or small, and outputs a failure notification signal to the failure notification device and the PWM signal generation unit 21. Specifically, the determination unit 28 calculates the four estimated DC current values Idce1, Idce2, Idce3, Idce4 and the three-phase sum current value Isum by the processing illustrated in FIGS. 3 to 6, performs the data processing 1, 2, 3 using these values, counts the determination parameters Njudg1, Njudg2, Njudg3, and determines the failure phase of the AC current sensors 14a to 14c and whether it is a large gain failure, or a small gain failure by using the counted determination parameters Njudg1, Njudg2, Njudg3.

The driver circuit 22 receives the PWM signal output from the PWM signal generation unit 21 and outputs a drive signal for switching ON/OFF of the power semiconductor of the inverter circuit 9.

Figure 2:
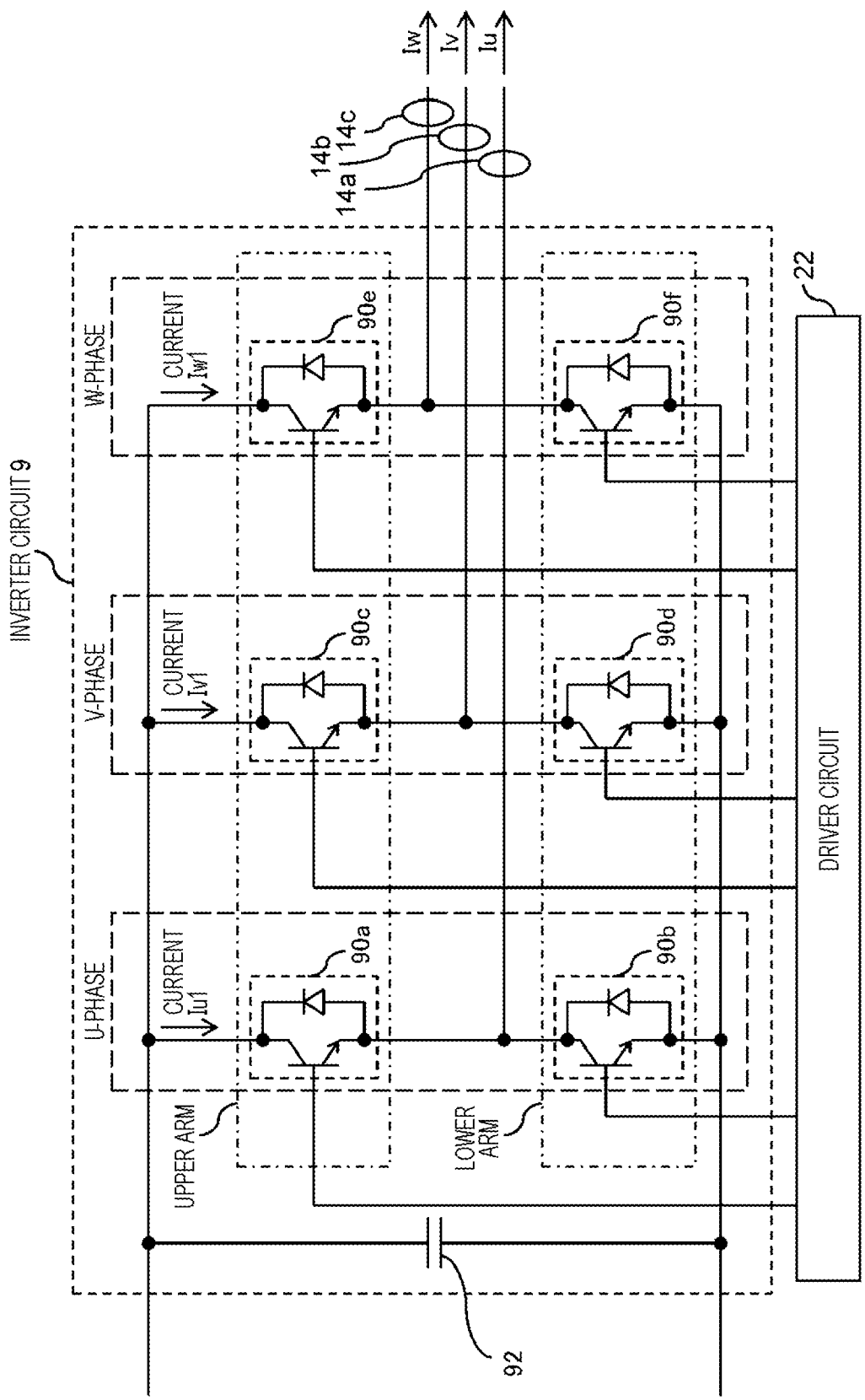
FIG. 2 is a diagram illustrating an exemplary internal configuration of an inverter circuit according to an embodiment of the present invention.

FIG. 2 is a diagram illustrating an exemplary internal configuration of the inverter circuit 9 according to an embodiment of the present invention.

The inverter circuit 9 includes a smoothing capacitor 92 and six power semiconductors 90a to 90f.

The power semiconductors 90a to 90f are switched between ON and OFF according to a drive signal input from the driver circuit 22 to convert DC power and AC power. The power semiconductors 90a to 90f include, for example, a power metal oxide semiconductor field effect transistor (MOSFET), an insulated gate bipolar transistor (IGBT), or the like. In the present embodiment, the upper three power semiconductors in the drawing are collectively referred to as an upper arm, and the lower three power semiconductors in the drawing are collectively referred to as a lower arm.

The smoothing capacitor 92 is a capacitor for smoothing the current generated by turning on/off the power semiconductors 90a to 90f and suppressing the ripple of the DC current supplied from the DC power supply 3 to the power converter 1. The smoothing capacitor 92 includes, for example, an electrolytic capacitor or a film capacitor.

Figure 3:
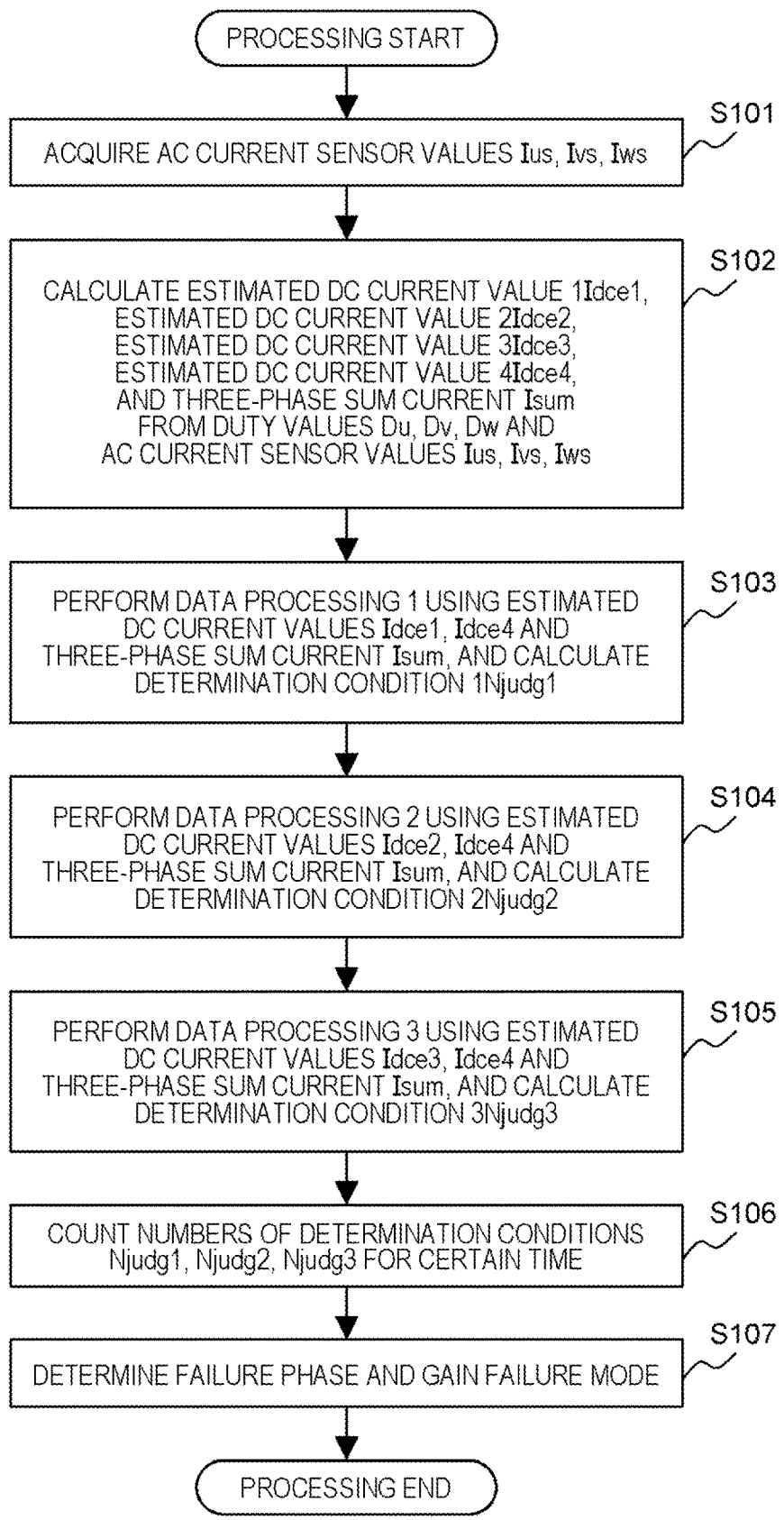
FIG. 3 is a flowchart of AC current sensor gain failure determination processing performed by an AC current sensor gain failure determination unit of a first embodiment.

FIG. 3 is a flowchart of AC current sensor gain failure determination processing performed by the AC current sensor gain failure determination unit 25 of a first embodiment. The AC current sensor gain failure determination processing illustrated in FIG. 3 is repeatedly performed at a predetermined timing (for example, at predetermined time intervals).

First, the AC current sensor gain failure determination unit 25 acquires the AC current sensor values Ius, Ivs, Iws (S101).

Thereafter, the estimated DC current calculation unit 26 calculates the estimated DC current values Idce1, Idce2, Idce3, Idce4 from the duty values Du, Dv, Dw of the PWM signals of the respective phases and the AC current sensor values Ius, Ivs, Iws by using the following equation, further calculates the three-phase sum current value Isum, and outputs the calculated values to the determination unit 28 (S102).

$$Idce1=(-Ivs-Iws)\times Du+Ivs\times Dv+Iws\times Dw$$

$$Idce2=Ius\times Du+(-Ius-Iws)\times Dv+Iws\times Dw$$

$$Idce3=Ius\times Du+Ivs\times Dv+(-Ius-Ivs)\times Dw$$

$$Idce4=(-Ivs-Iws)\times Du+(-Ius-Iws)\times Dv+(-Ius-Ivs)\times Dw$$

$$Isum=Ius+Ivs+Iws$$

The determination unit 28 performs the data processing 1 using the estimated DC current values Idce1, Idce4 and the three-phase sum current value Isum, and calculates a determination parameter 1Njudg1 (S103). Details of the data processing 1 will be described later with reference to FIG. 4.

The determination unit 28 performs the data processing 2 using the estimated DC current values Idce2, Idce4 and the three-phase sum current value Isum, and calculates a determination parameter 2Njudg2 (S104). Details of the data processing 2 will be described later with reference to FIG. 5.

The determination unit 28 performs the data processing 3 using the estimated DC current values Idce3, Idce4 and the three-phase sum current value Isum, and calculates a determination parameter 3Njudg3 (S105). Details of the data processing 3 will be described later with reference to FIG. 6.

Then, the determination unit 28 counts the determination parameters Njudg1, Njudg2, Njudg3 for a certain period of time (S106), and determines a failure phase and a gain failure mode (S107). Various methods can be adopted to determine the failure phase and the gain failure mode. For example, using a gain failure determination table (see FIGS. 7, 8, 9, 10), the failure phase and the gain failure mode can be determined by the tendency of increase and decrease of the determination parameters Njudg1, Njudg2, Njudg3. The failure phase and the gain failure mode may be determined using a function that outputs the failure phase and the gain failure mode using the determination parameters Njudg1, Njudg2, Njudg3 as inputs, or the failure phase and the gain failure mode may be determined using a failure determination model based on artificial intelligence.

FIG. 4 is a flowchart of the data processing 1 of the first embodiment.

The determination unit 28 performs the data processing 1 using the estimated DC current values Idce1, Idce4 and the three-phase sum current value Isum. The determination unit 28 first determines whether the three-phase sum current value Isum is positive or negative (S111). When the three-phase sum current value Isum is "positive", the determination unit 28 determines whether Determination Formula 1-1 is satisfied (S112). When the Determination Formula 1-1 is satisfied, the determination unit 28 increases the determination parameter Njudge1 by 1 (S113), and when the Determination Formula 1-1 is not satisfied, the determination unit 28 performs nothing.

$$Idce1-Idce4>Isum+Ihys \qquad \text{Determination Formula 1-1:}$$

On the other hand, when the three-phase sum current value Isum is "negative", the determination unit 28 determines whether Determination Formula 1-2 is satisfied (S114). When the Determination Formula 1-2 is satisfied, the determination unit 28 decreases the determination parameter Njudge1 by 1 (S115), and when the Determination Formula 1-2 is not satisfied, the determination unit 28 performs nothing.

$$Idce1-Idce4<Isum-Ihys \qquad \text{Determination Formula 1-2:}$$

The determination threshold Ihys may be a fixed value, but also may be a value obtained by calculating the amount of change in the target DC current using the following formula by using the torque command value change ΔTcmd, the motor rotational speed ω, the DC voltage value Vdc, and the power conversion efficiency η as variables and correcting with the calculated value. By correcting the determination threshold using the change amount of the target DC current, it is possible to follow the rapid change of the current according to the command.

$$\text{Determination threshold} = Ihys + ((\Delta Tcmd \times \omega)/(\eta \times Vdc))$$

FIG. 5 is a flowchart of data processing 2 of the first embodiment.

The determination unit 28 performs the data processing 2 using the estimated DC current values Idce2, Idce4 and the three-phase sum current value Isum. The determination unit 28 first determines whether the three-phase sum current value Isum is positive or negative (S121). When the three-phase sum current value Isum is "positive", the determination unit 28 determines whether Determination Formula 2-1 is satisfied (S122). When the Determination Formula 2-1 is satisfied, the determination unit 28 increases the determination parameter Njudge2 by 1 (S123), and when the Determination Formula 2-1 is not satisfied, the determination unit 28 performs nothing.

$$Idce2 - Idce4 > Isum + Ihys \qquad \text{Determination Formula 2-1:}$$

On the other hand, when the three-phase sum current value Isum is "negative", the determination unit 28 determines whether Determination Formula 2-2 is satisfied (S114). When the Determination Formula 2-2 is satisfied, the determination unit 28 decreases the determination parameter Njudge2 by 1 (S115), and when the Determination Formula 2-2 is not satisfied, the determination unit 28 performs nothing.

$$Idce2 - Idce4 < Isum - Ihys \qquad \text{Determination Formula 2-2:}$$

As described above, the determination threshold Ihys may be a fixed value, but also may be a value obtained by calculating the amount of change in the target DC current using the following formula by using the torque command value change ΔTcmd, the motor rotational speed ω, the DC voltage value Vdc, and the power conversion efficiency η as variables and correcting with the calculated value. By correcting the determination threshold using the change amount of the target DC current, it is possible to follow the rapid change of the current according to the command.

$$\text{Determination threshold} = Ihys + ((\Delta Tcmd \times \omega)/(\eta \times Vdc))$$

FIG. 6 is a flowchart of data processing 3 of the first embodiment.

The determination unit 28 performs the data processing 3 using the estimated DC current values Idce3, Idce4 and the three-phase sum current value Isum. The determination unit 28 first determines whether the three-phase sum current value Isum is positive or negative (S131). When the three-phase sum current value Isum is "positive", the determination unit 28 determines whether Determination Formula 3-1 is satisfied (S132). When the Determination Formula 3-1 is satisfied, the determination unit 28 increases the determination parameter Njudge3 by 1 (S133), and when the Determination Formula 3-1 is not satisfied, the determination unit 28 performs nothing.

$$Idce3 - Idce4 > Isum + Ihys \qquad \text{Determination Formula 3-1:}$$

When the three-phase sum current value Isum is "negative", the determination unit 28 determines whether Determination Formula 3-2 is satisfied (S134). When the Determination Formula 3-2 is satisfied, the determination unit 28 decreases the determination parameter Njudge3 by 1 (S135), and when the Determination Formula 3-2 is not satisfied, the determination unit 28 performs nothing.

$$Idce3 - Idce4 < Isum - Ihys \qquad \text{Determination Formula 3-2:}$$

As described above, the determination threshold Ihys may be a fixed value, but also may be a value obtained by calculating the amount of change in the target DC current using the following formula by using the torque command value change ΔTcmd, the motor rotational speed ω, the DC voltage value Vdc, and the power conversion efficiency η as variables and correcting with the calculated value. By correcting the determination threshold using the change amount of the target DC current, it is possible to follow the rapid change of the current according to the command.

$$\text{Determination threshold} = Ihys + ((\Delta Tcmd \times \omega)/(\eta \times Vdc))$$

FIG. 7 is a diagram illustrating a configuration example of a gain failure determination table 1 of the first embodiment.

The gain failure determination table 1 is used at the time of power running. In the gain failure determination table 1, the failure phase and the gain failure mode of the AC current sensors 14a to 14c are recorded in correspondence with the increase/decrease tendencies of the determination parameters Njudg1, Njudg2, Njudg3. The gain failure mode indicates whether it is a failure in which the AC current sensors 14a to 14c output a value larger than the true value or a value smaller than the true value, and the gain of the AC current sensors 14a to 14c is 1.0 in the normal state. At the time of power running, the determination unit 28 uses the gain failure determination table 1 to determine the failure phase and the gain failure mode of the AC current sensors 14a to 14c at the time of power running according to the increase/decrease tendencies of the determination parameters Njudg1, Njudg2, Njudg3 counted for the predetermined time T1. The determination unit 28 determines whether it is the power running time or the regeneration time on the basis of the target torque. For example, when the target torque is positive, it is the power running time, and when the target torque is negative, it is the regeneration time. The determination unit 28 may determine whether it is the power running time or the regeneration time by the estimated DC current. For example, when the one or more estimated DC currents are positive, it is the power running time, and when the one or more estimated DC currents are negative, it is the regeneration time.

FIG. 8 is a diagram illustrating a configuration example of a gain failure determination table 2 of the first embodiment.

The gain failure determination table 2 is used at the time of power running similarly to the gain failure determination table 1 (FIG. 7). In the gain failure determination table 2, the failure phase and the gain failure mode of the AC current sensors 14a to 14c are recorded in correspondence with the increase/decrease tendencies of the determination parameters Njudg1, Njudg2, Njudg3. When the failure phase and the gain failure mode cannot be determined by the gain failure determination table 1 (FIG. 7), the determination unit 28 uses the gain failure determination table 2 to determine the failure phase and the gain failure mode of the AC current sensors 14a to 14c at the time of power running on the basis of the increase/decrease tendencies of the determination parameters Njudg1, Njudg2, Njudg3 counted for the predetermined time T2.

That is, although the determination can be made by the gain failure determination table 1 (FIG. 7) in the ideal increase/decrease tendency of the determination parameter, there is a case where the condition defined in the gain failure determination table 1 is not satisfied depending on the threshold and the processing timing of the data processing 1 to 3, and there is a case where the determination result is obtained by using the gain failure determination table 2 (FIG. 8).

The determination condition in the gain failure determination table 1 and the determination condition in the gain failure determination table 2 may be integrated to form one gain failure determination table.

FIG. 9 is a diagram illustrating a configuration example of a gain failure determination table 3 of the first embodiment.

In the first embodiment, determination processing can be performed by the same algorithm during both power running and regeneration. However, since the tendency of the change in the estimated DC current value is different, it is necessary to use different determination tables at the time of power running and at the time of regeneration.

The gain failure determination table 3 is used at the time of regeneration. In the gain failure determination table 3, the failure phase and the gain failure mode of the AC current sensors 14a to 14c are recorded in correspondence with the increase/decrease tendencies of the determination parameters Njudg1, Njudg2, Njudg3. The determination unit 28 uses the gain failure determination table 3 to determine the failure phase and the gain failure mode of the AC current sensors 14a to 14c at the time of regeneration according to the increase/decrease tendencies of the determination parameters Njudg1, Njudg2, Njudg3 counted for the predetermined time T3.

FIG. 10 is a diagram illustrating a configuration example of a gain failure determination table 4 of the first embodiment.

The gain failure determination table 4 is used at the time of regeneration similarly to the gain failure determination table 3 (FIG. 9). In the gain failure determination table 4, the failure phase and the gain failure mode of the AC current sensors 14a to 14c are recorded in correspondence with the increase/decrease tendencies of the determination parameters Njudg1, Njudg2, Njudg3. When the failure phase and the gain failure mode cannot be determined by the gain failure determination table 3 (FIG. 9), the determination unit 28 uses the gain failure determination table 4 to determine the failure phase and the gain failure mode of the AC current sensors 14a to 14c at the time of power running on the basis of the increase/decrease tendencies of the determination parameters Njudg1, Njudg2, Njudg3 counted for the predetermined time T4.

That is, although the determination can be made by the gain failure determination table 3 (FIG. 9) in the ideal increase/decrease tendency of the determination parameter, there is a case where the condition defined in the gain failure determination table 3 is not satisfied depending on the threshold and the processing timing of the data processing 1 to 3, and there is a case where the determination result is obtained by using the gain failure determination table 4 (FIG. 10).

The determination condition in the gain failure determination table 3 and the determination condition in the gain failure determination table 4 may be integrated to form one gain failure determination table.

The predetermined times T1 to T4 for counting the determination parameters Njudg1, Njudg2, Njudg3 in the determination processing described above may be different or the same time, but it is preferable that T2 is set to be longer than T1, and T4 is set to be longer than T3.

FIG. 11 is a diagram illustrating a current waveform in a case where the U-phase AC current sensor 14a fails.

A failure occurs when the U-phase electrical angle is 360°, and the three-phase sum current value Isum, which is ideally 0 in a normal state, changes. Although not illustrated, since Idce1, Idce2, Idce3, Idce4 also change without synchronization, Idce1−Idce4 indicated by a dotted line, Idce2−Idce4 indicated by a broken line, and Idce3−Idce4 indicated by a one-dot chain line also start changing.

When the U-phase electrical angle is between 360° and 540°, Isum is positive, and therefore, Isum+Ihys becomes the upper limit determination threshold, Idce1−Idce4 does not exceed the determination threshold (a region within the determination threshold is indicated by a dot pattern), Idce2−Idce4 exceeds the determination threshold at point A, and Idce3-Idce4 exceeds the determination threshold at point B. When the U-phase electrical angle is between 540° and 720°, Isum is negative, and therefore, Isum−Ihys is the lower limit determination threshold, and Idce1−Idce4 is smaller than the determination threshold at point C. Therefore, 1 is added to the determination parameter Njudg2 at point A (U-phase electrical angle 380°, 740°, 1100°), 1 is added to the determination parameter Njudg3 at point B (U-phase electrical angle 460°, 820°, 1180°), and 1 is subtracted from the determination parameter Njudg1 at point C (U-phase electrical angle 580°, 940°, 1300°).

Assuming that the predetermined time for failure determination is three cycles, the determination parameter Njudg1 decreases by −3, the determination parameter Njudg2 increases by +3, and the determination parameter Njudg3 increases by +3. Therefore, referring to the gain failure determination table 1 (FIG. 7), it can be seen that a large gain failure occurs in the U-phase.

When a gain failure occurs in the AC current sensors 14a to 14c, the estimated DC current value and the three-phase sum current value change. In the first embodiment, on the basis of the principle that the three-phase sum current value becomes zero, the tendency of the increase/decrease of the estimated DC current value is determined using the four estimated DC current values (Idce1 to Idce4) calculated as the estimated AC current value for one phase or all three phases and the three-phase sum current value Isum, so that it is possible to determine whether the gain failure is large or small and the failure phase.

That is, when the U-phase AC current sensor 14a fails, Idce1 calculated without using Ius is a true value. Idce2, Idce3, and Idce4 change in waveforms different from that of the true value. For this reason, Idce1−Idec4 changes with a tendency different from differences (Idce2−Idce4, Idce3−Idce4) in other estimated DC current values. By determining this change on the basis of the deviation amount from the three-phase sum current value Isum, it is possible to determine the failure of the AC current sensor 14a.

As described above, in the first embodiment of the present invention, the failure of the AC current sensors 14a to 14c is determined on the basis of the change in each estimated DC current value. Specifically, the amount of deviation of the difference (for example, Idce1−Idec4) between the estimated DC current values and the three-phase sum current value Isum is compared with a predetermined threshold Ihys. Then, when the tendency of the change in one estimated DC current value (for example, Idce1) of the three estimated DC current values is different from the other estimated DC current values (for example, Idce2, Idce3), the U-phase AC current sensor 14a that has detected the AC current sensor value Ius that has not been used for the calculation of the estimated DC current value Idce1 having a different tendency of the change is determined to be a failure, so that a failure of the AC current sensors 14a to 14c can be accurately determined. Even when the degree of failure (gain difference) of the AC current sensors 14a to 14c is small, the failure of the AC current sensor can be detected. Even when the degree of the gain failure of the AC current sensors 14a to 14c changes, the relative relationship between each estimated DC current value and the three-phase sum current value does not change, so that the determination can be made by the same algorithm.

Second Embodiment

Next, a second embodiment of the present invention will be described. In the second embodiment, in step S107 in FIG. 3, the fluctuation frequencies of the estimated DC currents are compared to determine the failure phase of the AC current sensors 14a to 14c. In the second embodiment, the failure phase is determined, but the gain failure mode is not determined. In the following description of the second embodiment, portions different from those of the first embodiment will be mainly described, and configurations having the same functions as those of the first embodiment will be denoted by the same reference numerals, and description thereof will be omitted.

For example, when the U-phase gain failure occurs, the estimated DC current value Idce1 calculated without using the AC current sensor value Ius of the U-phase AC current sensor 14a is not affected by the frequency fluctuation of the AC current, but the estimated DC current values Idce2, Idce3 calculated using the AC current sensor value Ius of the U-phase AC current sensor 14a fluctuate in amplitude in proportion to the frequency of the AC current. That is, the estimated DC current value Idce1 and the estimated DC current values Idce2, Idce3 have different fluctuation frequencies. Therefore, changes in the estimated DC current values Idce1, Idce2, Idce3 are determined by the frequency, and the failure phase of the AC current sensors 14a to 14c is determined.

The determination unit 28 measures the estimated DC current values Idce1, Idce2, Idce3 only for predetermined time T5, calculates the fluctuation frequencies F1, F2, F3 of the estimated DC current, compares the magnitudes of the fluctuation frequencies F1, F2, F3 of the estimated DC current, and determines the failure phase of the AC current sensors 14a to 14c using the gain failure determination table 5 (see FIG. 12).

When there is no matching condition in the measurement result of the predetermined time T5 even if the gain failure determination table 5 (see FIG. 12) is used, the determination unit 28 may further measure the estimated DC current values Idce1, Idce2, Idce3 for the predetermined time T6, recalculate the fluctuation frequencies F1, F2, F3 of the estimated DC current, and make a redetermination using the result.

FIG. 12 is a diagram illustrating a configuration example of a gain failure determination table 5 of the second embodiment.

In the gain failure determination table 5, the failure phase of the AC current sensors 14a to 14c is recorded in correspondence with the magnitude relationship among the fluctuation frequencies F1, F2, F3 of the estimated DC current. The determination unit 28 uses the gain failure determination table 5, compares the magnitudes of the fluctuation frequencies F1, F2, F3 of the estimated DC current values Idce1, Idce2, Idce3 at the predetermined time T5, and determines that the AC current sensors 14a to 14c having the lowest fluctuation frequency have a failure.

As described above, according to the second embodiment of the present invention, the failure phase of the AC current sensors 14a to 14c can be determined by simple calculation.

Third Embodiment

Next, a third embodiment of the present invention will be described. In the third embodiment, in step S107 of FIG. 3, the differences (peak-to-peak values) between the maximum values and the minimum values of the calculated estimated DC current values Idce1, Idce2, Idce3 are compared to determine the failure phase of the AC current sensors 14a to 14c. In the third embodiment, the failure phase is determined, but the gain failure mode is not determined. In the following description of the 23rd embodiment, portions different from those of the first embodiment will be mainly described, and configurations having the same functions as those of the first embodiment will be denoted by the same reference numerals, and description thereof will be omitted.

For example, when the U-phase gain failure occurs, the peak-to-peak value of the estimated DC current value Idce1 calculated without using the AC current sensor value Ius of the U-phase AC current sensor 14a is not affected by the gain failure, but the peak-to-peak values of the estimated DC current values Idce1, Idce2, Idce3 calculated using the AC current sensor value Ius of the U-phase AC current sensor 14a increase in proportion to the degree of the gain failure. That is, when the AC current sensors 14a to 14c fail, peak-to-peak values of the calculated estimated DC current values are different. Therefore, changes in the estimated DC current values Idce1, Idce2, Idce3 are determined by the peak-to-peak values, and the failure phase of the AC current sensors 14a to 14c is determined.

The determination unit 28 measures the estimated DC current values Idce1, Idce2, Idce3 only for predetermined time T7, calculates peak-to-peak values Idce1p-p, Idce2p-p, Idce3p-p of the estimated DC current, compares the magnitudes of the peak-to-peak values Idce1p-p, Idce2p-p, Idce3p-p of the estimated DC current, and determines the failure phase of the AC current sensors 14a to 14c using the gain failure determination table 6 (see FIG. 13).

When there is no matching condition in the measurement result of the predetermined time T7 even if the gain failure determination table 6 (see FIG. 13) is used, the determination unit 28 may further measure the estimated DC current values Idce1, Idce2, Idce3 for the predetermined time T8, recalculate the peak-to-peak values Idce1p-p, Idce2p-p, Idce3p-p of the estimated DC current, and make a redetermination using the result.

FIG. 13 is a diagram illustrating a configuration example of a gain failure determination table 6 of the third embodiment.

In the gain failure determination table 6, the failure phase of the AC current sensors 14a to 14c is recorded in correspondence with the magnitude relationship among the peak-to-peak values Idce1p-p, Idce2p-p, Idce3p-p of the estimated DC current. The determination unit 28 uses the gain failure determination table 6, compares the magnitudes of the peak-to-peak values Idce1p-p, Idce2p-p, Idce3p-p of the estimated DC current values Idce1, Idce2, Idce3 at the predetermined time T7, and determines that the AC current sensors 14a to 14c having the smallest peak-to-peak value have a failure.

As described above, according to the third embodiment of the present invention, the failure phase of the AC current sensors 14a to 14c can be determined by simple calculation.

As described above, the control device 15 of the power converter 1 according to an embodiment of the present invention is a control device that controls the motor 2 via the inverter circuit 9 that supplies power converted from direct current to three-phase alternating current to the motor 2. The AC current sensors 14a to 14c that detect the AC currents of each phase of three-phase alternating current are provided at the output of the inverter circuit 9. The control device 15 (AC current sensor gain failure determination unit 25) calculates three estimated DC current values Idce1 to Idce3 using the duty value of the PWM signal for controlling the switching of the inverter circuit and AC current values (any two of Ius, Ivs, Iws) of two phases among the three phases detected by the current sensor, and determines the failure phase of the AC current sensors 14a to 14c on the basis of the change in each calculated estimated DC current value, so that the failure phase and the gain failure mode of the AC current sensor can be determined without providing the DC current sensor. Even when the degree of failure (gain difference) of the AC current sensors is small, the failure of the AC current sensor can be detected.

The AC current sensor gain failure determination unit 25 sets a value obtained by adding the change amount of the target DC current to a predetermined value as a predetermined threshold, and determines the phase in which the AC current sensors 14a to 14c have failed and the type of the failure on the basis of the comparison result between the value obtained by subtracting the estimated DC current value Idce4 from each of the estimated DC current values Idce1, Idce2, Idce3 and the predetermined threshold in which the difference with the three-phase sum current value Isum has been corrected. Therefore, it is possible to follow the rapid change of the current according to the command by correcting the determination threshold using the change amount of the target DC current.

The AC current sensor gain failure determination unit 25 collates the change in each of the calculated estimated DC current values with the first determination table (gain failure determination table 1, gain failure determination table 3) to perform first determination of determining the phase in which the AC current sensors 14a to 14c are failed and the type of the failure, and when the failure of the AC current sensors 14a to 14c cannot be determined by the first determination, collates the change in each of the calculated estimated DC current values with the second determination table (gain failure determination table 2, gain failure determination table 4) to perform second determination of determining the phase in which the AC current sensors 14a to 14c are failed and the type of the failure. Therefore, it is possible to accurately determine the failure of the AC current sensor regardless of the influence of noise or the degree of the gain failure (gain difference).

The AC current sensor gain failure determination unit 25 performs third determination of determining the failure of the AC current sensors 14a to 14c on the basis of the change in each calculated estimated DC current value in first time, and when the failure of the AC current sensors 14a to 14c cannot be determined by the third determination, performs fourth determination of determining the failure of the AC current sensors 14a to 14c on the basis of the change in each calculated estimated DC current value in second time longer than the first time. Therefore, the failure of the AC current sensor can be determined accurately and in a short time regardless of the influence of noise or the degree of the gain failure (gain difference).

Since the AC current sensor gain failure determination unit 25 determines that the AC current sensors 14a to 14c have failed for the phase having the smallest frequency of the calculated estimated DC current value, it is possible to determine the failure phase of the AC current sensors 14a to 14c by simple operation.

Since the AC current sensor gain failure determination unit 25 determines that the current sensor has failed for the phase having the smallest difference between the maximum value and the minimum value of the calculated estimated DC current value, it is possible to determine the failure phase of the AC current sensors 14a to 14c by simple calculation.

The AC current sensor gain failure determination unit 25 performs fifth determination of determining the failure of the AC current sensors 14a to 14c on the basis of the frequency in each calculated estimated DC current value in third time, and when the failure of the AC current sensors 14a to 14c cannot be determined by the fifth determination, performs sixth determination of determining the failure of the AC current sensors 14a to 14c on the basis of the frequency in each calculated estimated DC current value in fourth time longer than the third time. Therefore, the failure of the AC current sensor can be determined accurately and in a short time regardless of the influence of noise or the degree of the gain failure (gain difference).

Note that the present invention is not limited to the above-described embodiments, but includes various modifications and equivalent configurations within the scope of the attached claims. For example, each of the embodiments described above has been described in detail in order to explain the present invention in an easy-to-understand manner, and the present invention is not necessarily limited to those having all the configurations described in the embodiments. A part of the configuration of an embodiment may be replaced by the configuration of another embodiment. A configuration of another embodiment may be added to a configuration of an embodiment.

With respect to part of the configuration of each embodiment, other configurations may be added, deleted, or replaced.

Further, each of the above-described configurations, functions, processing units, processing means, and the like may be realized by hardware by designing a part or all of them by, for example, an integrated circuit, and may be implemented by software by a processor interpreting and executing a program for implementing each function.

Information such as programs, tables, files, and the like that realize each function can be stored in a storage device such as a memory, a hard disk, or a solid state drive (SSD), or a storage medium such as an IC card, an SD card, or a DVD.

Also, control lines and information lines indicate what is considered to be necessary for explanation, and all control lines and information lines that are required for implementation are not necessarily shown. In practice, it can be considered that almost all the structures are mutually connected.

REFERENCE SIGNS LIST

1 power converter
2 motor
3 DC power supply
4 abnormality notification device
7 angle sensor value
9 inverter circuit
10 voltage sensor
14a to 14c AC current sensor 15 control device
17 target current calculation unit
19 duty calculation unit
21 PWM signal generation unit
22 driver circuit
23 motor speed calculation unit
25 AC current sensor gain failure determination unit
26 estimated DC current calculation unit
28 determination unit
90a to 90f power semiconductor
92 smoothing capacitor

The invention claimed is:

1. A control device that controls a motor via an inverter circuit that supplies power converted from direct current to three-phase alternating current to the motor, the control device comprising:
a current sensor that detects AC current of each phase of three-phase alternating current provided at an output of the inverter circuit,
wherein the control device calculates three estimated DC current values by using a duty value of a PWM signal for controlling switching of the inverter circuit and an AC current value of two phases among three phases detected by the current sensor, and determines a failure of the current sensor on the basis of a change in each of the estimated DC current values that have been calculated, the control device configured to determine that the current sensor fails in a phase having a smallest frequency of the estimated DC current values that have been calculated.

2. The control device according to claim 1, wherein, when a change tendency of one of the three estimated DC current values is different from a change tendency of another one of the three estimated DC current values, it is determined that a current sensor that has detected an AC current value that has not been used for calculation of the one of the three estimated DC current values having a different change tendency is a failure.

3. The control device according to claim 1, wherein
a duty value of a U-phase PWM signal is defined as Du, a duty value of a V-phase PWM signal is defined as Dv, a duty value of a W-phase PWM signal is defined as Dw, a U-phase AC current value is defined as Ius, a V-phase AC current value is defined as Ivs, and a W-phase AC current value is defined as Iws, and
the control device
calculates a first estimated DC current value Idce1 by using Du, Dv, Dw, Ivs, and Iws,
calculates a second estimated DC current value Idce2 by using Du, Dv, Dw, Iws, and Ius,
calculates a third estimated DC current value Idce3 by using Du, Dv, Dw, Ius, and Ivs, calculates a fourth estimated DC current value Idce4 by using Du, Dv, Dw, Ius, Ivs, and Iws, and
determines a phase in which the current sensor fails and a type of a failure based on a comparison result between a difference between a value obtained by subtracting the fourth estimated DC current value Idce4 from each of the first estimated DC current value Idce1, the second estimated DC current value Idce2, and the third estimated DC current value Idce3 and a three-phase sum current value Isum, and a predetermined threshold Ihys.

4. The control device according to claim 3, the control device configured to
calculate the first estimated DC current value Idce1, the second estimated DC current value Idce2, the third estimated DC current value Idce3, and the fourth estimated DC current value Idce4 by using the following formulae,
when the three-phase sum current value Isum is positive and Determination Formula 1-1 is satisfied, increase a determination parameter Njudge1 by 1,
when the three-phase sum current value Isum is negative and Determination Formula 1-2 is satisfied, decrease the determination parameter Njudge1 by 1,
when the three-phase sum current value Isum is positive and Determination Formula 2-1 is satisfied, increase a determination parameter Njudge2 by 1,
when the three-phase sum current value Isum is negative and Determination Formula 2-2 is satisfied, decrease the determination parameter Njudge2 by 1,
when the three-phase sum current value Isum is positive and Determination Formula 3-1 is satisfied, increase a determination parameter Njudge3 by 1,
when the three-phase sum current value Isum is negative and Determination Formula 3-2 is satisfied, decrease the determination parameter Njudge3 by 1, and
determine a phase in which the current sensor fails and a type of a failure based on change amounts of the determination parameters Njudge1, Njudge2, Njudge3 in a predetermined time, $$Idce1 = (-Ivs - Iws) \times Du + Ivs \times Dv + Iws \times Dw$$

$$Idce2 = Ius \times Du + (-Ius - Iws) \times Dv + Iws \times Dw$$

$$Idce3 = Ius \times Du + Ivs \times Dv + (-Ius - Ivs) \times Dw$$

$$Idce4 = (-Ivs - Iws) \times Du + (-Ius - Iws) \times Dv + (-Ius - Ivs) \times Dw$$

| | |
|---|---|
| Idce1−Idce4>Isum+Ihys | Determination Formula 1-1 |
| Idce1−Idce4<Isum−Ihys | Determination Formula 1-2 |
| Idce2−Idce4>Isum+Ihys | Determination Formula 2-1 |
| Idce2−Idce4<Isum−Ihys | Determination Formula 2-2 |
| Idce3−Idce4>Isum+Ihys | Determination Formula 3-1 |
| Idce3−Idce4<Isum−Ihys | Determination Formula 3-2. |

5. The control device according to claim 3, the control device configured to
correct the predetermined threshold by adding a change amount of a target DC current to a predetermined value, and
determine the phase in which the current sensor fails and the type of the failure based on a comparison result between a value obtained by subtracting the fourth estimated DC current value Idce4 from each of the first estimated DC current value Idce1, the second estimated DC current value Idce2, and the third estimated DC current value Idce3 and the predetermined threshold in which a difference with the three-phase sum current value Isum has been corrected.

6. The control device according to claim 1, the control device configured to
perform first determination of determining a phase in which the current sensor fails and a type of a failure by collating a change in each of the estimated DC current values that have been calculated, with a first determination table, and
when the failure of the current sensor cannot be determined by the first determination, perform second determination of determining the phase in which the current sensor fails and the type of the failure by collating a change in each of the estimated DC current values that have been calculated, with a second determination table.

7. The control device according to claim 1, the control device configured to
perform third determination of determining the failure of the current sensor based on a change in each of the estimated DC current values that have been calculated, in a first time, and
when the failure of the current sensor cannot be determined by the third determination, perform fourth determination of determining the failure of the current sensor based on a change in each of the estimated DC current values that have been calculated, in a second time longer than the first time.

8. The control device according to claim 1, the control device configured to
perform fifth determination of determining the failure of the current sensor based on a frequency of each of the estimated DC current values that have been calculated, in a third time, and
when the failure of the current sensor cannot be determined by the fifth determination, perform sixth determination of determining the failure of the current sensor based on the frequency of each of the estimated DC current values that have been calculated, in a fourth time longer than the third time.

9. The control device according to claim 1, the control device configured to determine that the current sensor fails in a phase having a smallest difference between a maximum value and a minimum value of the estimated DC current values that have been calculated.

10. The control device according to claim 9, the control device configured to
perform seventh determination of determining the failure of the current sensor based on the difference between the maximum value and the minimum value in each of the estimated DC current values that have been calculated, in a fifth time, and
when the failure of the current sensor cannot be determined by the seventh determination, perform eighth determination of determining the failure of the current sensor based on the difference between the maximum value and the minimum value in each of the estimated DC current values that have been calculated, in a sixth time longer than the fifth time.

11. A method of determining a failure of a current sensor performed by a control device that controls a motor via an inverter circuit that supplies power converted from direct current to three-phase alternating current to the motor,
wherein a current sensor that detects alternating current of each phase of three-phase alternating current is provided at an output of the inverter circuit,
the method comprising, by the control device,
calculating estimated DC current values by using a duty value of a PWM signal for controlling switching of the inverter circuit and an AC current value of two phases among three phases detected by the current sensor, and
by the control device, determining a failure of the current sensor on the basis of a change in the estimated DC current values that have been calculated, the control device configured to determine that the current sensor fails in a phase having a smallest difference between a maximum value and a minimum value of the estimated DC current values that have been calculated.

12. A control device that controls a motor via an inverter circuit that supplies power converted from direct current to three-phase alternating current to the motor, the control device comprising:
a current sensor that detects AC current of each phase of three-phase alternating current provided at an output of the inverter circuit,
wherein the control device calculates three estimated DC current values by using a duty value of a PWM signal for controlling switching of the inverter circuit and an AC current value of two phases among three phases detected by the current sensor, and determines a failure of the current sensor on the basis of a change in each of the estimated DC current values that have been calculated, the control device configured to:
perform first determination of determining a phase in which the current sensor fails and a type of a failure by collating a change in each of the estimated DC current values that have been calculated, with a first determination table, and
when the failure of the current sensor cannot be determined by the first determination, perform second determination of determining the phase in which the current sensor fails and the type of the failure by collating a change in each of the estimated DC current values that have been calculated, with a second determination table.

* * * * *